(12) United States Patent  
Kobayashi et al.

(10) Patent No.: US 11,855,134 B2  
(45) Date of Patent: Dec. 26, 2023

(54) SEMICONDUCTOR DEVICE AND METHOD OF MANUFACTURING SEMICONDUCTOR DEVICE

(71) Applicant: FUJI ELECTRIC CO., LTD., Kawasaki (JP)

(72) Inventors: Yusuke Kobayashi, Nagareyama (JP); Yasuhiko Oonishi, Matsumoto (JP); Masanobu Iwaya, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 221 days.

(21) Appl. No.: 17/038,838

(22) Filed: Sep. 30, 2020

(65) Prior Publication Data

US 2021/0028276 A1 Jan. 28, 2021

Related U.S. Application Data

(62) Division of application No. 15/660,302, filed on Jul. 26, 2017, now Pat. No. 10,840,326.

(30) Foreign Application Priority Data

Aug. 5, 2016 (JP) .................................. 2016-155088

(51) Int. Cl.
*H01L 29/06* (2006.01)
*H01L 29/08* (2006.01)
*H01L 29/10* (2006.01)
*H01L 29/78* (2006.01)
*H01L 29/16* (2006.01)

(52) U.S. Cl.
CPC ...... *H01L 29/0623* (2013.01); *H01L 29/0615* (2013.01); *H01L 29/0878* (2013.01);
(Continued)

(58) Field of Classification Search
CPC ............. H01L 29/0615; H01L 29/7811; H01L 29/0623; H01L 29/063; H01L 29/0638;
(Continued)

(56) References Cited

U.S. PATENT DOCUMENTS

2010/0044825 A1* 2/2010 Schmidt .............. H01L 29/8611
257/493
2011/0147766 A1* 6/2011 Tarui ................... H01L 29/8611
257/77
(Continued)

FOREIGN PATENT DOCUMENTS

JP 2002033479 A 1/2002
WO 2015166608 A1 11/2015

OTHER PUBLICATIONS

Dai Okamoto et al., "13-kV, 20-A 4H—SiC PiN Diodes for Power System Applications", Materials Science Forum, vol. 778-780, pp. 855-858, 2014.
(Continued)

*Primary Examiner* — Younes Boulghassoul
*Assistant Examiner* — Quinton A Brasfield
(74) *Attorney, Agent, or Firm* — Rabin & Berdo, P.C.

(57) ABSTRACT

A semiconductor device includes, as a semiconductor region in which semiconductor layers are formed, an active region through which current flows and an edge termination structure region outside the active region and in which an edge termination structure is formed. The semiconductor device includes as the semiconductor layers: a drift layer of a first conductivity type and a base layer of a second conductivity type, in contact with the edge termination region; and includes an interlayer insulating film provided on the semiconductor region, on a side thereof where the base layer is formed. The edge termination region has a first semiconductor layer of the second conductivity type, continuous from the base layer and having an outer peripheral end not in contact with the interlayer insulating film, and a second semiconductor layer of the first conductivity type, in contact with the first semiconductor layer and forming a first PN junction therewith.

19 Claims, 10 Drawing Sheets

(52) U.S. Cl.
CPC ...... *H01L 29/1095* (2013.01); *H01L 29/1608* (2013.01); *H01L 29/7811* (2013.01); *H01L 29/7813* (2013.01); *H01L 29/0619* (2013.01)

(58) Field of Classification Search
CPC ............. H01L 29/7813; H01L 29/7825; H01L 29/66613–66628; H01L 29/42336; H01L 29/42352; H01L 29/4236; H01L 29/7823; H01L 29/0619
See application file for complete search history.

(56) References Cited

U.S. PATENT DOCUMENTS

| | | | | |
|---|---|---|---|---|
| 2013/0320487 | A1* | 12/2013 | Mauder | H01L 29/872 257/E21.546 |
| 2014/0231969 | A1* | 8/2014 | Mauder | H01L 29/1095 438/495 |
| 2015/0021670 | A1* | 1/2015 | Schulze | H01L 29/404 257/288 |
| 2015/0060887 | A1* | 3/2015 | Arai | H01L 29/045 257/77 |
| 2015/0097262 | A1* | 4/2015 | Mauder | H01L 29/0619 257/493 |
| 2015/0333168 | A1* | 11/2015 | Hirler | H01L 29/7802 257/329 |
| 2017/0221998 | A1 | 8/2017 | Corp | |
| 2017/0263755 | A1 | 9/2017 | Kudou et al. | |

OTHER PUBLICATIONS

Ranbir Singh et al., "SiC Power Schottky and PiN Diodes", IEEE Transactions on Electron Devices, vol. 49, No. 4, pp. 665-672, Apr. 2002.

* cited by examiner

BURIED JTE

CONVENTIONAL EDGE REGION

NO MESA

BV=1312 V 3.701e+00
6.472e-03
1.132e-05
1.979e-08
3.462e-11
6.054e-14
1.059e-16

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2016-155088, filed on Aug. 5, 2016, the entire contents of which are incorporated herein by reference.

BACKGROUND OF THE INVENTION

1. Field of the Invention

Embodiments of the invention relate to a semiconductor device and a method of manufacturing a semiconductor device such as a vertical metal oxide semiconductor field effect transistor (MOSFET) of a wide bandgap semiconductor.

2. Description of the Related Art

Conventionally, silicon (Si) is used as a constituent material of a power semiconductor device that controls high voltage and/or large current. There are several types of power semiconductor devices such as bipolar transistors, insulated-gate bipolar transistors (IGBTs), and MOSFETs. These devices are selectively used according to intended purpose.

For example, bipolar transistors and IGBTs have high current density compared to MOSFETs, and can be adapted for large current but cannot be switched at high speed. In particular, the limit of switching frequency is about several kHz for bipolar transistors and about several tens of kHz for IGBTs. On the other hand, power MOSFETs have low current density compared to bipolar transistors and IGBTs, and are difficult to be adapted for large current but can be switched at high speed up to about several MHz.

However, there has been a strong demand in the market for a power semiconductor device achieving both large current and high speed. Thus, IGBTs and power MOSFETs have been intensively developed and improved, and the performance of power devices has substantially reached the theoretical limit determined by the material. In terms of power semiconductor devices, semiconductor materials replacing silicon have been investigated and silicon carbide (SiC) has been focused on as a semiconductor material enabling production (manufacture) of a next-generation power semiconductor device having a low on voltage, high-speed characteristics, and high-temperature characteristics.

Silicon carbide is chemically a very stable semiconductor material, has a wide band gap of 3 eV, and can be used very stably as a semiconductor even at high temperatures. Silicon carbide has a critical electric field strength that is ten times that of silicon or greater, and thus is expected to be a semiconductor material that can sufficiently reduce on-resistance. These merits of silicon carbide are common to other wide band gap semiconductors (hereinafter, wide band gap semiconductor) having a band gap greater than silicon, such as gallium nitride (GaN). Thus, lower resistance and higher voltages of a semiconductor device can be achieved by using a wide band gap semiconductor.

In a power semiconductor device using a wide bandgap semiconductor material, to retain the breakdown voltage in the OFF state, an edge termination structure has to be provided in an edge termination structure region in an outer peripheral portion of the device. A method of forming a junction termination extension (JTE) at a mesa portion is a typical example of such (for example, refer to Ranbir Singh, et al., "SiC Power Schottky and PiN Diodes", IEEE Transactions on Electron Devices, Vol. 49, No. 4, APRIL 2002; and Dai Okamoto, et al., "13-kV, 20-A 4H-SiC PiN Diodes for Power System Applications", Materials Science Forum, Vol. 778-780, pp 855-858, 2014). An edge termination structure region may preferably have a shorter horizontal width since the device area may be thereby reduced.

SUMMARY OF THE INVENTION

According to one aspect of the present invention, a semiconductor device has an active region through which current flows and an edge termination structure region arranged outside the active region and in which an edge termination structure is formed. The semiconductor device includes a low-concentration semiconductor layer of a first conductivity type, having a low concentration, and formed in the edge termination structure region, on a front surface of a semiconductor substrate of the first conductivity type and having a high concentration; and a second semiconductor layer of a second conductivity type, in contact with one of a semiconductor layer of the second conductivity type in the active region and a semiconductor layer of the second conductivity type in contact with a source electrode, the second semiconductor layer having an impurity concentration that is lower than that of the semiconductor layer, the second semiconductor layer not in contact with a surface of the semiconductor substrate.

Objects, features, and advantages of the present invention are specifically set forth in or will become apparent from the following detailed description of the invention when read in conjunction with the accompanying drawings.

DETAILED DESCRIPTION OF THE INVENTION

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Notations of n or p appended with the same symbol of + or − indicates that concentrations are close and does not necessary mean that the concentrations are equal. In the description of the embodiments below and the accompanying drawings, portions that are identical will be given the same reference numerals and will not be repeatedly described. Further, in the present description, when Miller indices are described, "−" means a bar added to an index immediately after the "−", and a negative index is expressed by prefixing "−" to the index.

Figure 17:
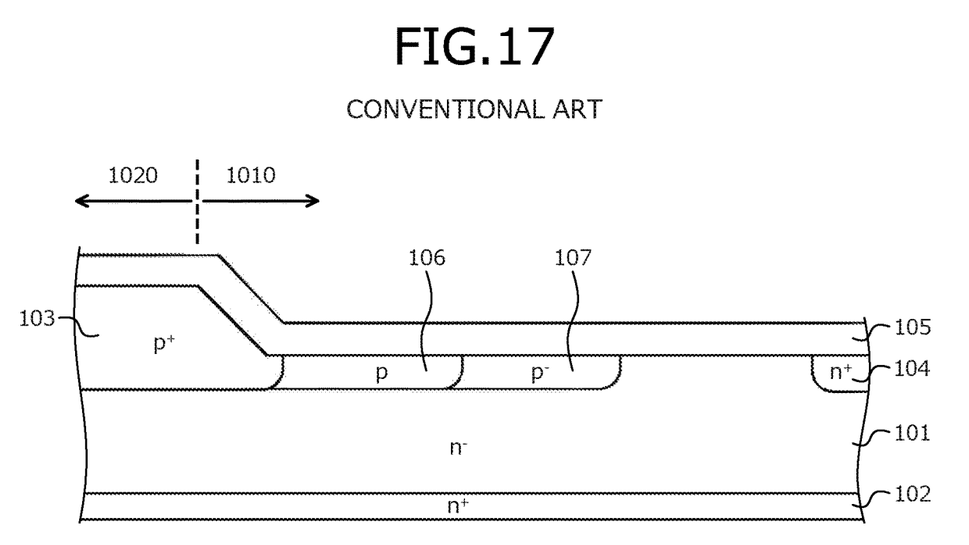
FIG. 17 is a cross-sectional view of an edge termination structure region of a conventional semiconductor device.

FIG. 17 is a cross-sectional view of an edge termination structure region of a conventional semiconductor device. In a conventional edge termination structure region 101, when patterning is implemented in a region having a height different from an active region (active region) 102, like a mesa portion, the focus depth of the photolithography differs whereby processing difficulty increases. Thus, it is more desirable for the edge termination structure region 101 to have the same height as the active region 102. The semiconductor device depicted in FIG. 17 has a p$^+$-type base layer 3, an n$^+$-type channel stopper region 4, an interlayer insulating film 5, a first JTE region (p-type layer) 6, and a second JTE region (p$^-$-type layer) 7 formed on a front surface side of an n$^-$-type silicon carbide epitaxial layer 1 formed on an n$^+$-type silicon carbide substrate 2.

Figure 18:
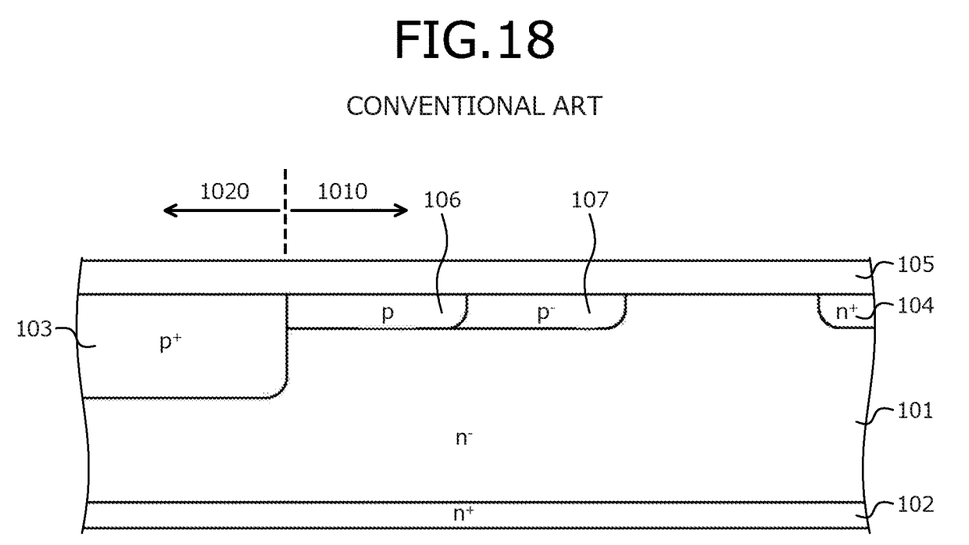
FIG. 18 is a cross-sectional view of an edge termination structure region of a conventional semiconductor device in which no mesa portion is formed.

FIG. 18 is a cross-sectional view of an edge termination structure region of a conventional semiconductor device in which no mesa portion is formed. When the edge termination structure region 101 and the active region 102 are the same height, electric field concentrates at a corner portion of the p$^+$-type base layer 3 formed at an end of the active region 102, leading to decreases in breakdown voltage.

Figure 19A:
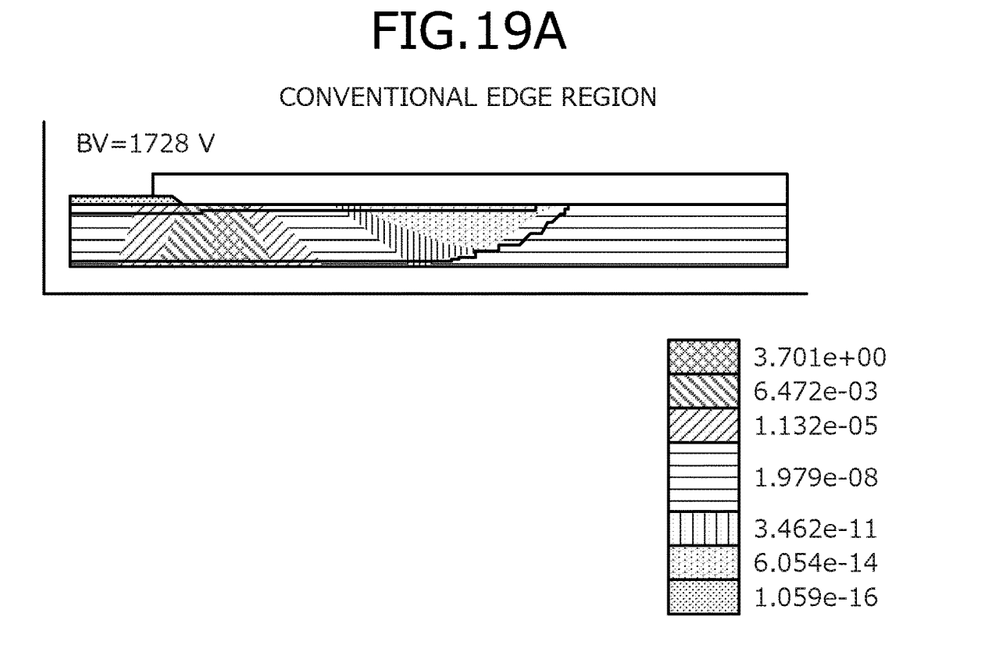
FIGS. 19A and 19B are diagrams depicting breakdown voltage measurement results obtained by simulation of the conventional edge termination structure regions.
Figure 19B:
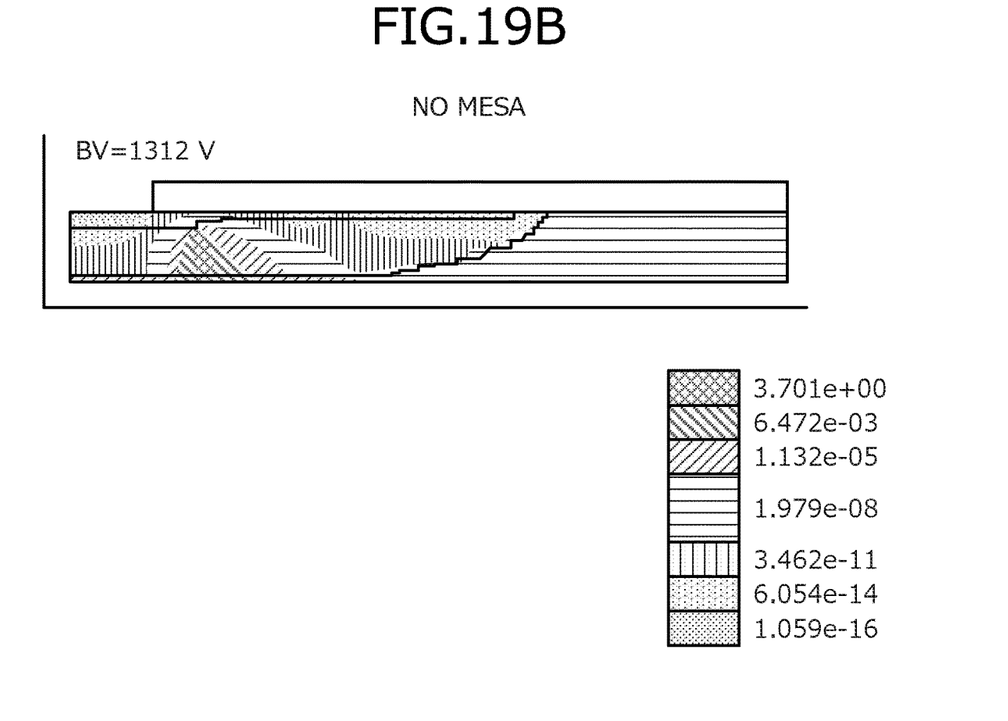

FIGS. 19A and 19B are diagrams depicting breakdown voltage measurement results obtained by simulation of the conventional edge termination structure region. FIG. 19A shows the breakdown voltage of the edge termination structure region 101 depicted in FIG. 17, in the case of a 1200V rating. FIG. 19B shows the breakdown voltage for the edge termination structure region 101 depicted in FIG. 18, in the case of a 1200V rating. It is found that the breakdown voltage of the structure depicted in FIG. 18 decreases more than the breakdown voltage of the structure depicted in FIG. 17.

Further, for the purpose of shortening the edge termination structure region 101, preferably, the dose amount of the p-type layers 6, 7 in a vertical direction is adjusted so that the concentration exhibits a gradually decreasing gradation from the end of the active region 102 toward the device end. However, for example, when a spatial modulation structure is used to achieve horizontal gradation in the edge termination structure region 101, a problem arises in that process variations occur in relation to patterning accuracy, increasing processing difficulty.

According to the present embodiments, the concentration of electric field at a corner portion of a semiconductor layer of a second conductivity type at the end of the active region may be mitigated, enabling the breakdown voltage to be improved.

The semiconductor device and the method of manufacturing a semiconductor device according to the present invention enable the breakdown voltage of an edge termination structure region without a mesa portion to be improved and enable a horizontal length of the edge termination structure region to be shortened.

The semiconductor device according to the present embodiments may be configured using a wide bandgap semiconductor. In a first embodiment, for example, a silicon carbide semiconductor device produced using silicon carbide (SiC) as a wide bandgap semiconductor will be described taking a MOSFET as an example. However, the present invention is not limited to SiC, and may be implemented using any wide bandgap semiconductor material, such as silicon dioxide, aluminium nitride, gallium nitride, boron nitride, and diamond. Furthermore, in the described example, a first conductivity type is assumed to be an n-type and the second conductivity type is assumed to be a p-type.

Figure 1:
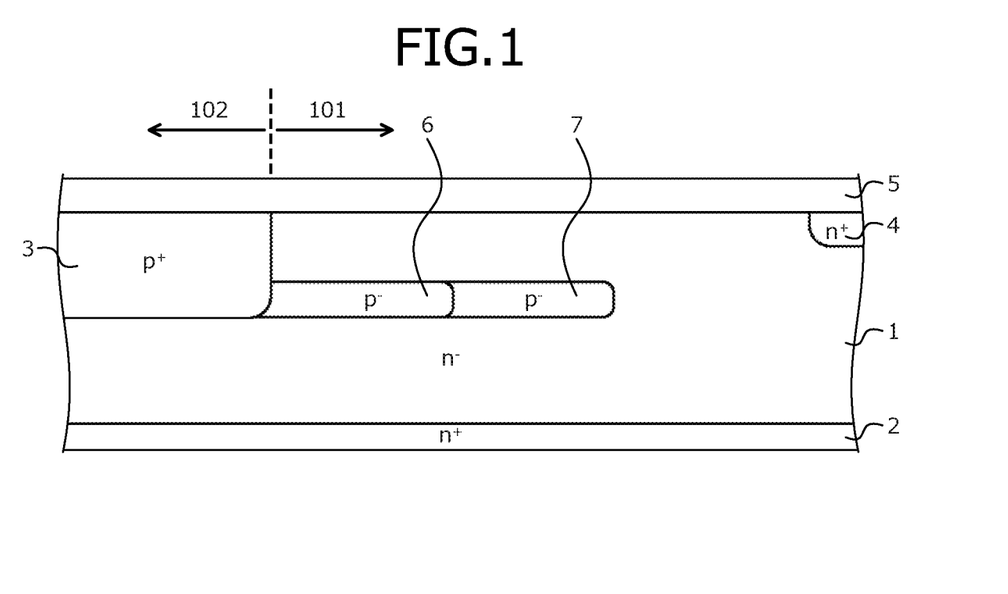
FIG. 1 is a cross-sectional view of an edge termination structure region of a silicon carbide semiconductor device according to a first embodiment.

FIG. 1 is a cross-sectional view of the edge termination structure region of the silicon carbide semiconductor device according to the first embodiment. An n$^-$-type silicon carbide epitaxial layer (wide bandgap semiconductor deposition layer) 1 is deposited on a first main surface (also referred to as an 0001 face or Si face) of the wide bandgap semiconductor substrate 2, which in the present embodiment is an n$^+$-type silicon carbide substrate 2.

The n$^+$-type silicon carbide substrate 2 is, for example, a silicon-carbide single crystal substrate doped with nitrogen (N). The n$^-$-type silicon carbide epitaxial layer 1 has an impurity concentration that is lower than that of the n$^+$-type silicon carbide substrate 2 and, for example, the n$^-$-type silicon carbide epitaxial layer 1 is a low-concentration n-type drift layer doped with nitrogen. Hereinafter, the n$^+$-type silicon carbide substrate 2 alone, or the n$^+$-type silicon carbide substrate 2 and the n$^-$-type silicon carbide epitaxial layer 1 together will be regarded as a silicon carbide semiconductor substrate.

On the front surface side of the n$^-$-type silicon carbide epitaxial layer 1, the p$^+$-type base layer (p$^+$-type layer) 3 is formed in the active region 102; the second JTE region 7 (p$^-$-type layer 7) and the first JTE region 6 (p$^-$-type layer 6)

in contact with the p$^+$-type base layer 3 are formed in the edge termination structure region 101; and the n$^+$-type channel stopper region 4 is formed at an end portion of the edge termination structure region 101. The height of a lower portion of the p$^+$-type layer 3 at the end of the active region 102 and the height of lower portions of the p$^-$-type layer 6 and the p$^-$-type layer 7 forming a JTE region are arranged within ±0.3 μm. The p$^-$-type layer 6 and the p$^-$-type layer 7 each has a bottom that is at a same position as the p$^+$-type layer 3 in a height (depth) direction of the p$^+$-type layer 3 and each has a height that is lower than that of the p$^+$-type layer 3.

Figure 2:
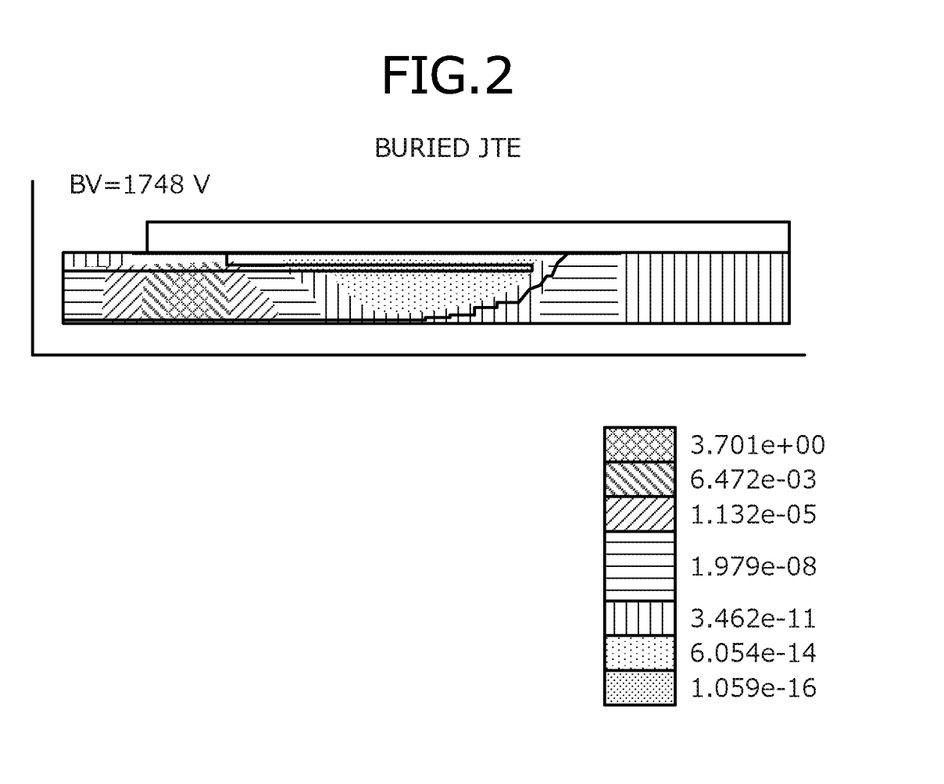
FIG. 2 is a diagram depicting breakdown voltage measurement results obtained by simulation of the edge termination structure region of the first embodiment.

FIG. 2 is a diagram depicting breakdown voltage measurement results obtained by simulation of the edge termination structure region of the first embodiment. According to the structure of the edge termination structure region 101 depicted in FIG. 1, the concentration of electric field at the corner portion of the p$^+$-type layer 3 at the end of the active region 102 may be mitigated, enabling the breakdown voltage to be improved. Preferably, the p$^-$-type layer 6, which is a JTE region, may have an impurity concentration that is higher than that of the p$^-$-type layer 7.

Figure 3:
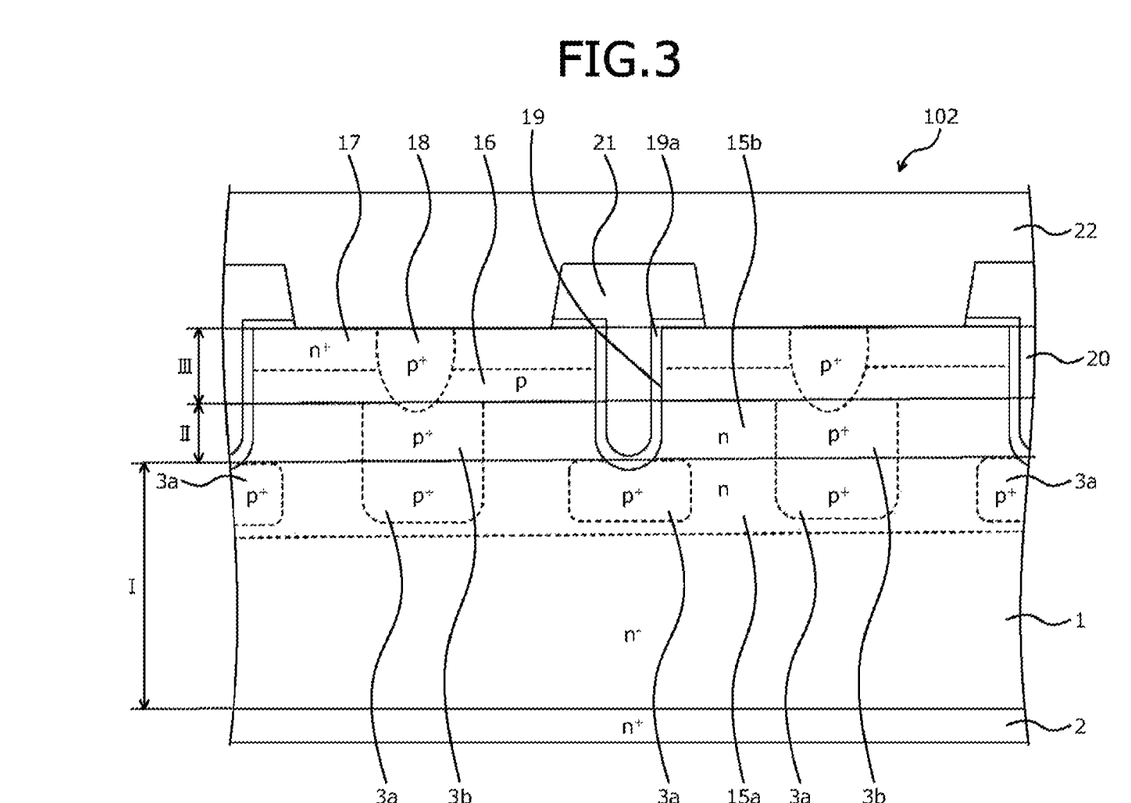
FIG. 3 is a cross-sectional view of an example of a structure of an active region of a semiconductor device according to the first embodiment.

FIG. 3 is a cross-sectional view of an example of a structure of the active region of the semiconductor device according to the first embodiment. As shown in FIG. 3, a silicon carbide (SiC) epitaxial layer 1 is formed on an n$^+$-type silicon carbide substrate 2. The silicon carbide epitaxial layer 1 formed on the silicon carbide substrate 2 has an n$^-$-type concentration. On the first main surface side of the n$^-$-type silicon carbide epitaxial layer 1, a high-concentration n-type layer (first n-type CSL region) 15a is formed. The n-type layer 15a has an impurity concentration that is lower than that of the n$^+$-type silicon carbide substrate 2 and higher than that of the n-type silicon carbide epitaxial layer 1; and, for example, the n-type region 15a is doped with nitrogen.

On a rear surface of the n$^+$-type silicon carbide substrate 2 opposite the side facing the n$^-$-type silicon carbide epitaxial layer 1, a rear electrode is provided constituting a drain electrode. The silicon carbide substrate surface is patterned by photolithography and subject to ion implantation of nitrogen whereby the n-type layer 15a is formed so as not to be formed in the edge termination structure region 101.

In a portion of the n-type layer 15a, the p$^+$-type layer 3a is formed in plural by patterning and ion implantation of aluminum. The p$^+$-type layer 3a may preferably have an activated impurity concentration of about $1.0 \times 10^{17}$ to $1.0 \times 10^{19}$ cm$^{-3}$ and a depth of about 0.1 to 1.5 μm.

The n-type layer 15a and the p$^+$-type layer 3a are formed in a first region I of the n$^-$-type layer 1. In one embodiment, after forming the n-type layer 15a and the p$^+$-type layer 3a, an additional region (region II) of the n$^-$-type layer 1 is formed by epitaxial growth. The additional region (region II) is formed with added nitrogen, such that silicon carbide having a concentration equal to that of the first region (region I) of the n$^-$-type layer 1 is deposited to a thickness of 0.1 to 1.5 μm.

Further, a second n-type CSL region (n-type layer) 15b is formed on the n-type layer 15a by patterning by photolithography and ion implantation of nitrogen so as not to be formed in the edge termination structure region 101. Here, the n-type layer 15b is formed to make formation of a region having about the same concentration as the n$^-$-type layer 1 impossible. In other words, the n-type layer 15b may be formed in the region II of the n$^-$-type layer 1 to have a different n-type concentration than the n$^-$-type layer 1. In one embodiment, the n-type layer 15b has a same n-type concentration as the n-type layer 15a.

Further, the p$^+$-type layer 3b is formed by patterning and ion implantation of aluminum so as to be electrically connected to the p$^+$-type layer 3a. The p$^+$-type layer 3b may preferably have an activated impurity concentration of about $1.0 \times 10^{17}$ to $1.0 \times 10^{19}$ cm$^{-3}$ and a depth of about 0.2 to 2.0 μm.

After forming the p$^+$-type layer 3b, silicon carbide is deposited to a thickness of 0.1 to 1.5 μm by epitaxial growth with added nitrogen or aluminum whereby a region III of the silicon carbide epitaxial layer 1 is formed.

A p-type channel region (p-type layer) 16 is formed by patterning by photolithography and ion implantation of aluminum so as not to be formed in the edge termination structure region 101. The p-type layer 16 may preferably have an activated impurity concentration of about $1.0 \times 10^{16}$ to $1.0 \times 10^{19}$ cm$^{-3}$ and a depth of about 0.3 to 1.5 μm. Further, an n-type source region (n$^+$-type layer) 17 is formed by patterning by photolithography and ion implantation of phosphorus, or arsenic, or nitrogen. The n$^+$-type layer 17 may preferably have an activated impurity concentration of about $1.0 \times 10^{18}$ to $1.0 \times 10^{20}$ cm$^{-3}$ and a depth of about 0.05 to 0.5 μm.

Further, a p-type region (p$^+$-type layer) 18 is formed by patterning by photolithography and ion implantation of aluminum so as to be electrically connected to the p$^+$-type layer 3b. The p$^+$-type layer 18 may preferably have an activated impurity concentration of about $1.0 \times 10^{17}$ to $1.0 \times 10^{20}$ cm$^{-3}$ and a depth of about 0.2 to 2.0 μm.

Further, after a carbon film of about 0.01 to 5.0 μm is deposited (not shown), annealing at 1500 degrees C. to 1900 degrees C. is performed whereby the ion implanted impurities are activated. A trench 19 is formed by patterning by photolithography and dry etching so as not to penetrate the p$^+$-type layer 3a. The trench 19 may preferably have a width of 0.1 to 1.5 μm and a depth of about 0.2 to 2.0 μm. The trench may be formed to penetrate into, but not through, the p$^+$-type layer 3a in the n-type layer 15a. An insulating film 19a of poly-silicon is deposited so as to cover the interior of the trench 19; and the insulating film 19a, for example, may be formed by a high-temperature oxide (HTO) film having a thickness of 30 nm to 200 nm formed by a low-pressure CVD method at a high temperature of about 600 to 900 degrees C.

After the insulating film 19a is deposited so as to be embedded in the trench 19, etching is performed so as to leave the poly-silicon in at least ⅔ of the depth of the trench 19, forming a gate electrode 20. Further, after an oxide film (not shown) having a thickness of about 0.1 to 3.0 μm is deposited, an interlayer insulating film 21 is formed by patterning and etching.

Further, one or more of titanium, nickel, tungsten, aluminum is deposited by a deposition or sputtering method to have a total thickness of about 0.5 to 8.0 μm and a source electrode 22 is formed by patterning and etching. As described, the active region depicted in the first embodiment is configured.

In FIG. 3, although three trench structures are depicted, more trench MOS structures may be arranged in parallel. The p$^+$-type layer 18 or the source electrode 22 in the active region 102 is in contact with the p$^+$-type layer (semiconductor layer) 3 of the edge termination structure region 101.

The p$^+$-type layer 3 of the edge termination structure region 101 of the silicon carbide semiconductor device depicted in FIG. 1 is assumed to be the same as the p$^+$-type layer 3a of the active region 102 depicted in FIG. 3; however, the p⁺-type layer 3 and the p⁺-type layer 3a may be different.

FIGS. 4, 5, 6, 7, and 8 are cross-sectional views of the edge termination structure region of the semiconductor device according to the first embodiment during manufacturing processes. Manufacturing processes of the edge termination structure region will be described with reference to these cross-sectional views.

Figure 4:
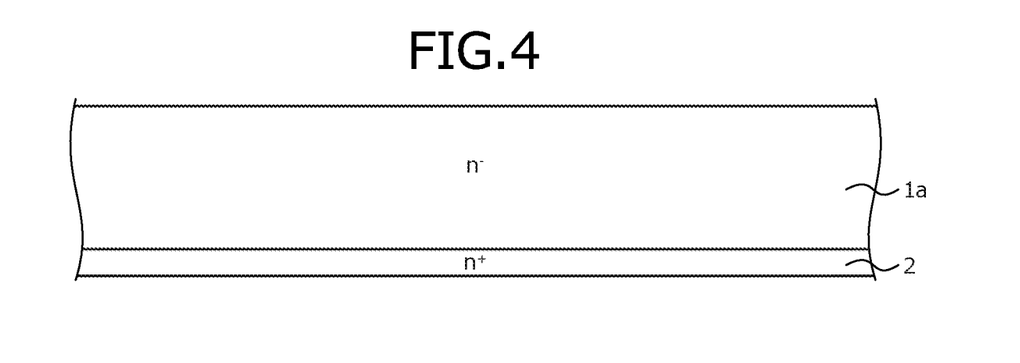
FIGS. 4, 5, 6, 7, and 8 are cross-sectional views of the edge termination structure region of the semiconductor device according to the first embodiment during manufacturing processes.

First, as depicted in FIG. 4, the n⁻-type layer 1a is formed on the n⁺-type silicon carbide substrate 2 by epitaxial growth with added nitrogen. The concentration of the n⁻-type layer 1a may be preferably about $1.0\times10^{14}$ to $1.0\times10^{17}$ cm⁻³ and the thickness thereof may be preferably about 4 μm to 100 μm. In one embodiment, the n⁻-type layer 1a corresponds to the n⁻-type layer 1 of FIG. 3, or in other words, is formed at the same time and in the same process as the n⁻-type layer 1 of FIG. 3, but on a different region of the silicon carbide substrate 2. On the rear surface of the n⁺-type silicon carbide substrate 2, the rear electrode is provided constituting the drain electrode.

Figure 5:
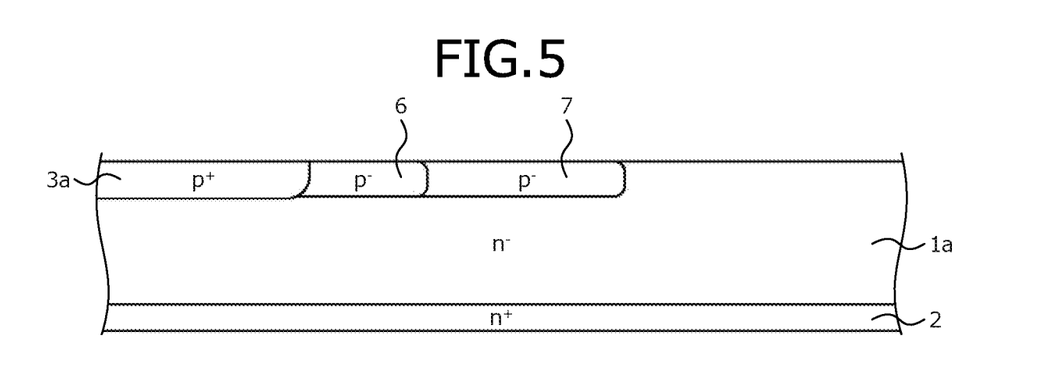

Next, as depicted in FIG. 5, the p⁺-type base layer (p⁺-type layer) 3a is formed in the n⁻-type layer 1a by patterning and ion implantation of aluminum. The activated impurity concentration of the p⁺-type layer 3a may be preferably about $1.0\times10^{17}$ to $1.0\times10^{19}$ cm⁻³ and the depth thereof may be preferably about 0.1 to 1.5 μm. Further, the p⁻-type layer 6 is formed at a position at a side portion of the p⁺-type layer 3a by patterning and ion implantation of aluminum. The activated impurity concentration of the p⁻-type layer 6 may be preferably about $1.0\times10^{16}$ to $1.0\times10^{18}$ cm⁻³ and the depth thereof may be preferably about 0.1 to 1.5 μm. Further, at a side portion of the p⁻-type layer 6, the p⁻-type layer 7 is formed by patterning and ion implantation of aluminum so as to have an activated impurity concentration that is lower than that of the p⁻-type layer 6. The p⁻-type layer 7 may preferably have an activated impurity concentration of about $8.0\times10^{15}$ to $8.0\times10^{17}$ cm⁻³ and a depth of about 0.1 to 1.5 μm.

Figure 6:
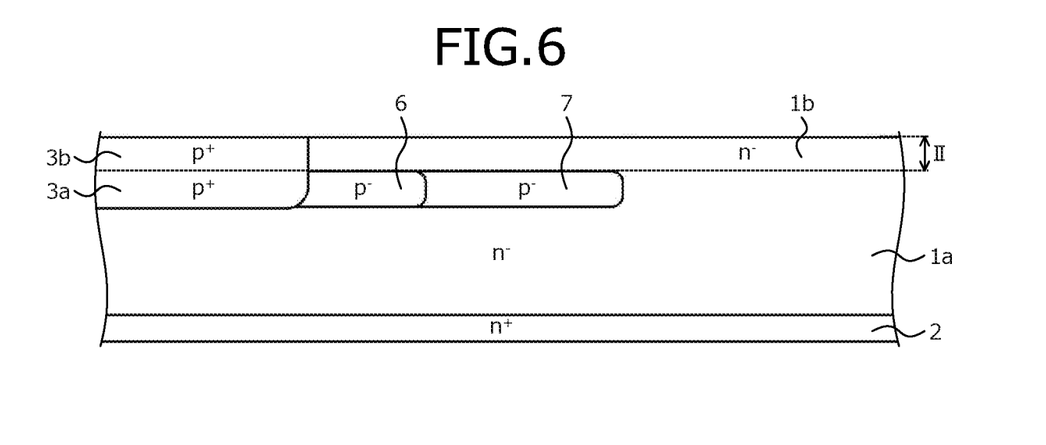

Next, as depicted in FIG. 6, on the n⁻-type layer 1a, an n⁻-type layer 1b is formed by epitaxial growth with added nitrogen whereby the region II is formed on the previously formed region (region I). The n⁻-type layer 1b may preferably have a concentration that is equal to that of the n⁻-type layer 1a and that is about $1.0\times10^{14}$ to $1.0\times10^{17}$ cm⁻³. The n⁻-type layer 1b may preferably have a thickness of about 0.1 μm to 1.5 μm and at a position on the p⁺-type layer 3a, the p⁺-type layer 3b is formed by patterning and ion implantation of aluminum so as to be electrically connected to the p⁺-type layer 3a. The p⁺-type layer 3b may preferably have an activated impurity concentration of about $1.0\times10^{17}$ to $1.0\times10^{19}$ cm⁻³ and a depth of about 0.2 to 2.0 μm.

Figure 7:
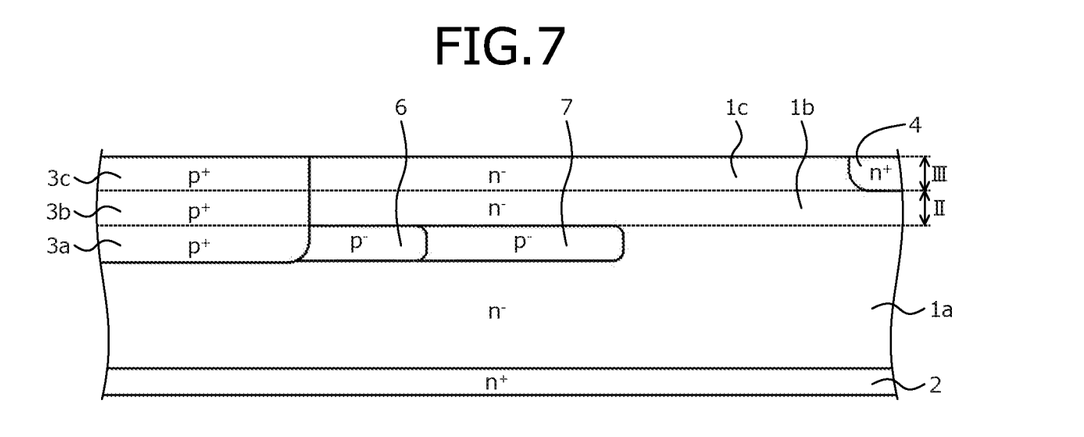

Next, as depicted in FIG. 7, on the n⁻-type layer 1b, an n⁻-type layer 1c is formed by epitaxial growth with added nitrogen whereby region III is formed. The n⁻-type layer 1c may preferably have a concentration that is equal to that of the n⁻-type layer 1a and that is about $1.0\times10^{14}$ to $1.0\times10^{17}$ cm⁻³. The n⁻-type layer 1c may preferably have a thickness of about 0.1 μm to 1.5 μm and at a position on the p⁺-type layer 3b, a p⁺-type layer 3c is formed by patterning and ion implantation of aluminum so as to be electrically connected to the p⁺-type layers 3a, 3b. The p⁺-type layer 3c may preferably have an activated impurity concentration of about $1.0\times10^{17}$ to $1.0\times10^{20}$ cm⁻³ and a depth of about 0.2 to 2.0 μm. Further, the p⁺-type layer 3c may be formed concurrently with the p⁺-type layer 18 of the active region 102.

Thereafter, at an end portion of the n⁻-type layer 1c, the n⁺-type channel stopper region (n⁺-type layer) 4 is formed by patterning by photolithography and ion implantation of phosphorus, or arsenic, or nitrogen. The n⁺-type layer 4 may preferably have an activated impurity concentration of about $1.0\times10^{18}$ to $1.0\times10^{20}$ cm⁻³ and a depth of about 0.05 to 0.5 μm. Further, the n⁺-type layer 4 may be formed concurrently with the n⁺-type layer 17 of the active region 102. After a carbon film (not shown) of about 0.01 to 5.0 μm is deposited, annealing at 1500 degrees C. to 1900 degrees C. is performed whereby the ion implanted ions are activated.

Figure 8:
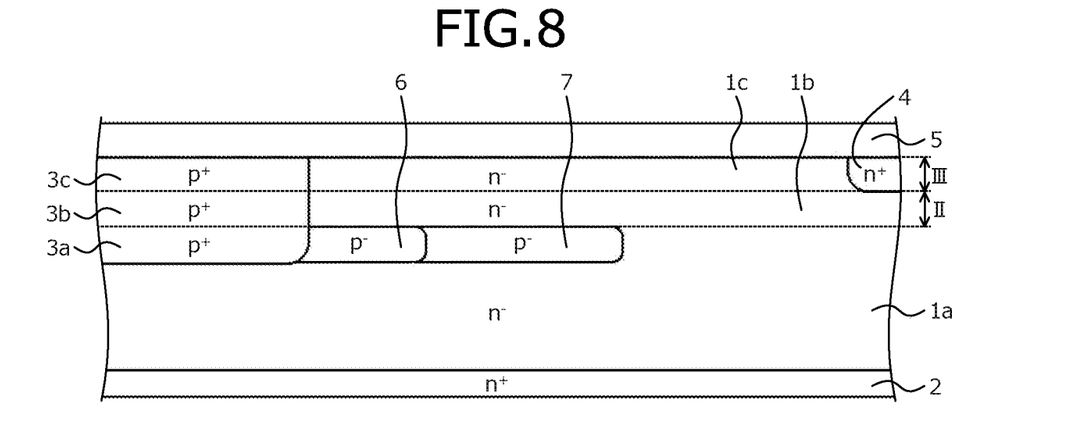

Next, as depicted in FIG. 8, an oxide film having a thickness of about 0.1 to 3.0 μm is deposited forming an interlayer insulating film 5. The interlayer insulating film 5 may be formed concurrently with the interlayer insulating film 21 of the active region 102. By the processes described above, the edge termination structure region 101 of the first embodiment may be formed.

The semiconductor device according to the present embodiment may be configured using a wide bandgap semiconductor. In a second embodiment, for example, a silicon carbide semiconductor device produced using silicon carbide (SiC) as a wide bandgap semiconductor will be described taking a MOSFET as an example.

Figure 9:
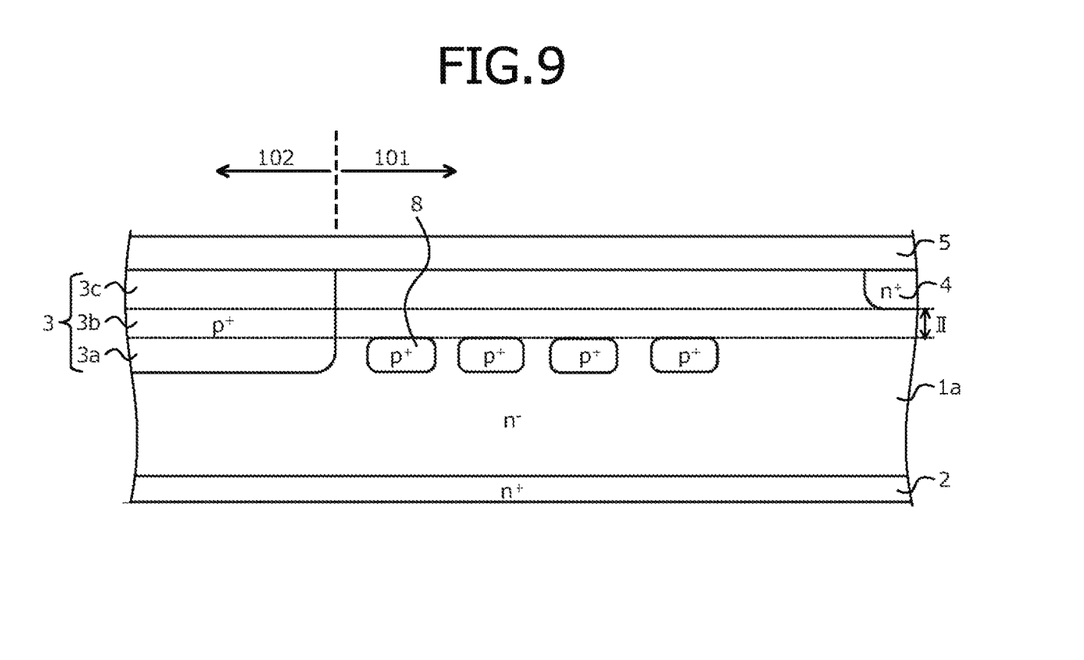
FIG. 9 is a cross-sectional view of the edge termination structure region of the semiconductor device according to a second embodiment.

FIG. 9 is a cross-sectional view of the edge termination structure region of the semiconductor device according to the second embodiment. In the second embodiment as well, an example of a structure of the active region 102 is similar to that of the first embodiment (FIG. 3) and a method of producing the active region 102 is also similar to that of the first embodiment.

Further, the method of producing the edge termination structure region 101 is similar to up to the process of forming the p⁺-type layer 3a as described in the first embodiment (a portion of FIGS. 4 and 5).

As depicted in FIG. 9, p-type guard ring regions (p⁺-type layers) 8 are formed in a direction of an end portion by patterning and ion implantation of aluminum so as to have a bottom at a same position as (or co-planar with) the bottom of the p⁺-type layer 3a. The p⁺-type layers 8 may preferably have an activated impurity concentration of about $1.0\times10^{17}$ to $1.0\times10^{19}$ cm⁻³ and a depth of about 0.1 to 1.5 μm. Further, the p⁺-type layers 8 may be formed concurrently with the p⁺-type layer 3a.

Subsequently, on the n⁻-type layer 1a, the n⁻-type layer 1b is formed by epitaxial growth with added nitrogen whereby the region II is formed. Thereafter, production is by processes similar to those of the first embodiment. By the processes described above, the edge termination structure region 101 of the second embodiment may be formed.

As depicted in FIG. 9, the p⁺-type layers 8 are arranged separate from the p⁺-type layer 3 at the end of the active region 102 and heights of lower portions of the p⁺-type layer 3 and the p⁺-type layers 8 are within ±0.3 μm. The p⁺-type layers 8 function as a guard ring structure and may mitigate the concentration of electric field at the corner portion of the p⁺-type layer 3, enabling improved breakdown voltage. The concentration of the p⁺-type layers 8 may be preferably the same concentration as the p⁺-type layer 3 whereby formation by a single ion implantation session is enabled. A horizontal interval between the p⁺-type layers 8 may be preferably narrow and may be about 0.01 μm to 1.0 μm at a location nearest the end of the active region 102. More preferably, intervals of increasing distance from the end of the active region 102, widening stepwise may be set.

Figure 10:
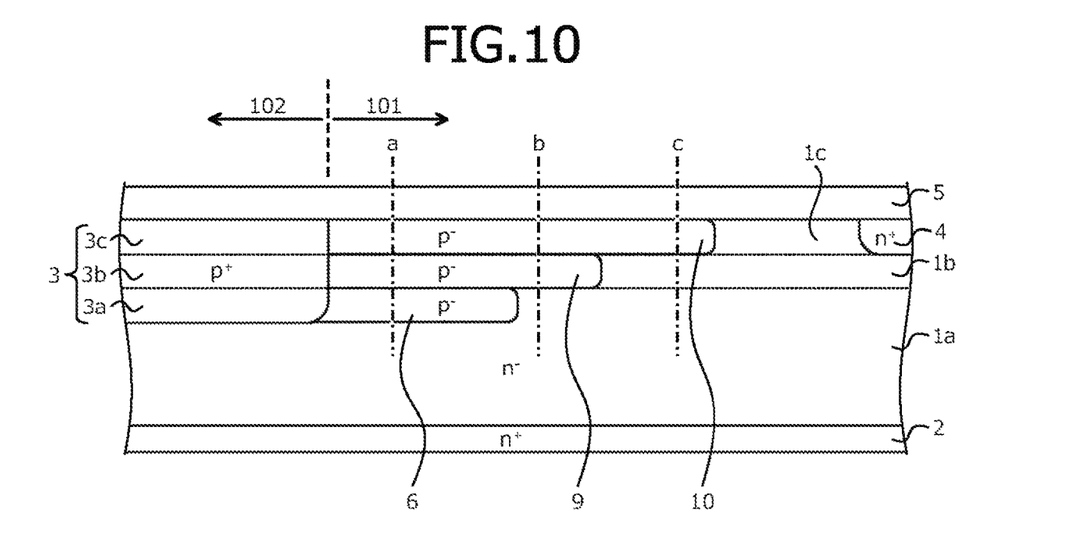
FIG. 10 is a cross-sectional view of the edge termination structure region of the semiconductor device according to a third embodiment.

FIG. 10 is a cross-sectional view of the edge termination structure region of the semiconductor device according to a third embodiment. In the third embodiment, for example, a silicon carbide semiconductor device produced using silicon carbide (SiC) as a wide bandgap semiconductor will be described taking a MOSFET as an example. In the third embodiment as well, an example of a structure of the active region 102 is similar to that of the first embodiment (FIG. 3) and a method of producing the active region 102 is also similar to that of the first embodiment.

Further, the method of producing the edge termination structure region 101 is similar up to the process of forming the p$^-$-type layer 6 as described in the first embodiment (FIGS. 4 and 5). Subsequently, on the n$^-$-type layer 1a, the n$^-$-type layer 1b (refer to FIG. 6) is formed by epitaxial growth with added nitrogen. The n$^-$-type layer 1b may preferably have a concentration that is equal to that of the n$^-$-type layer 1a and that is about $1.0 \times 10^{14}$ to $1.0 \times 10^{17}$ cm$^{-3}$. The n$^-$-type layer 1b may preferably have a thickness of about 0.1 μm to 1.5 μm. Next, at a position of the p$^+$-type layer 3a, the p$^+$-type layer 3b is formed by patterning and ion implantation of aluminum so as to be electrically connected to the p$^+$-type layer 3a (refer to FIG. 6).

Next, as depicted in FIG. 10, a third JTE region (p$^-$-type layer) 9 is formed by patterning and ion implantation of aluminum so that at least a portion thereof is positioned on top of the p$^-$-type layer 6. The p$^-$-type layer 9 may preferably have an activated impurity concentration of about $1.0 \times 10^{16}$ to $1.0 \times 10^{18}$ cm$^{-3}$ and a depth of about 0.1 to 1.5 μm.

On the n$^-$-type layer 1b, the n$^-$-type layer 1c (refer to FIG. 7) is formed by epitaxial growth with added nitrogen. The n$^-$-type layer 1c may preferably have a concentration that is equal to that of the n$^-$-type layer 1a and that is about $1.0 \times 10^{14}$ to $1.0 \times 10^{17}$ cm$^{-3}$. The n$^-$-type layer 1c may preferably have a thickness of about 0.1 μm to 1.5 μm. Next, as depicted in FIG. 10, a fourth JTE region (p$^-$-type layer) 10 is formed by patterning and ion implantation of aluminum so that at least a portion thereof is positioned on top of the p$^-$-type layer 6. The p$^-$-type layer 10 may preferably have an activated impurity concentration of about $1.0 \times 10^{16}$ to $1.0 \times 10^{18}$ cm$^{-3}$ and a depth of about 0.1 to 1.5 μm. Thereafter, production is by processes similar to those of the first embodiment. By the processes described above, the edge termination structure region 101 of the third embodiment may be formed.

According to the structure depicted in FIG. 10, effects identical to those of the first embodiment (FIG. 1) may be obtained. The structure in FIG. 10, unlike the first embodiment (FIG. 1), is a structure in which the p$^-$-type concentration does not change along the horizontal direction in the edge termination structure region 101 and that is able to maintain the breakdown voltage by having a concentration gradation in a height direction. The p$^-$-type layer 6 is arranged within ±0.3 μm of the height of the lower portion of the p$^+$-type layer 3 at the end of the active region 102. Integral values of the acceptor concentration in the height direction indicated by dose amounts of the p$^-$-type layers are assumed to be, in the drawing, a-line dose amount>b-line dose amount>c-line dose amount whereby the gradation in the horizontal direction of the edge termination structure region 101 is formed and the same breakdown voltage as that in the first embodiment (FIG. 1) is obtained.

Figure 11:
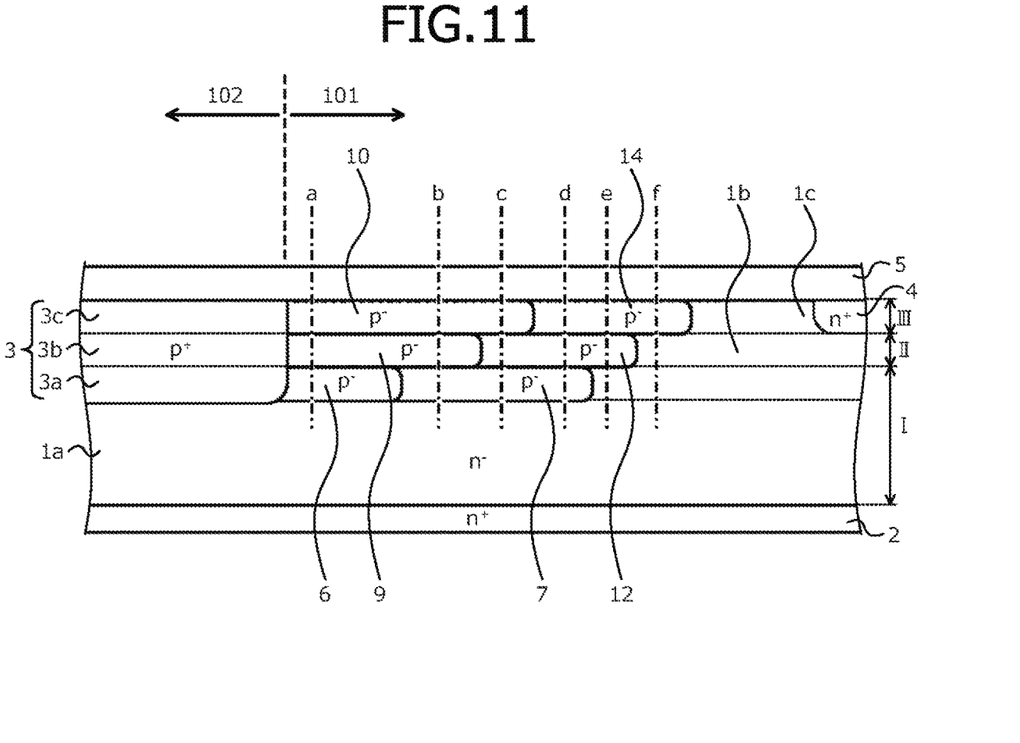
FIG. 11 is a cross-sectional view of the edge termination structure region of the semiconductor device according to a fourth embodiment.

FIG. 11 is a cross-sectional view of the edge termination structure region of the semiconductor device according to a fourth embodiment. In the fourth embodiment, for example, a silicon carbide semiconductor device produced using silicon carbide (SiC) as a wide bandgap semiconductor will be described taking a MOSFET as an example. In the fourth embodiment as well, an example of a structure of the active region 102 is similar to that of the first embodiment (FIG. 3) and a method of producing the active region 102 is also similar to that of the first embodiment.

Further, the method of producing the edge termination structure region 101 is similar up to the process of forming the p$^+$-type layer 3b as described in the first embodiment (FIGS. 4 to 6). Subsequently, as depicted in FIG. 11, the p$^-$-type layer 9 is formed by patterning and ion implantation of aluminum so that at least a portion thereof is positioned on top of the p$^-$-type layer 6. The p$^-$-type layer 9 may preferably have an activated impurity concentration of about $1.0 \times 10^{16}$ to $1.0 \times 10^{18}$ cm$^{-3}$ and a depth of about 0.1 to 1.5 μm. Next, a fifth JTE region (p$^-$-type layer) 12 is formed by patterning and ion implantation of aluminum so that at least a portion thereof is positioned on top of the p$^-$-type layer 7 and is contiguous with the p$^-$-type layer 9. The p$^-$-type layer 12 may preferably have an activated impurity concentration of about $1.0 \times 10^{16}$ to $1.0 \times 10^{18}$ cm$^{-3}$ and a depth of about 0.1 to 1.5 μm.

Next, on the n$^-$-type layer 1b, the n$^-$-type layer 1c is formed by epitaxial growth with added nitrogen (refer to FIG. 7). The n$^-$-type layer 1c may preferably have a concentration that is equal to that of the n$^-$-type layer 1a and that is about $1.0 \times 10^{14}$ to $1.0 \times 10^{17}$ cm$^{-3}$. The n$^-$-type layer 1c may preferably have a thickness that is about 0.1 μm to 1.5 μm. The p$^+$-type layer 3c is formed by patterning and ion implantation of aluminum so as to be electrically connected to the p$^+$-type layer 3a (refer to FIG. 7). The p$^+$-type layer 3c may preferably have an activated impurity concentration of about $1.0 \times 10^{17}$ to $1.0 \times 10^{20}$ cm$^{-3}$ and a depth of about 0.2 to 2.0 μm. Further, the p$^+$-type layer 3c may be formed concurrently with the p$^+$-type layer 18 of the active region 102.

Subsequently, the p$^-$-type layer 10 is formed by patterning and ion implantation of aluminum so that at least a portion thereof is positioned on top of the p$^-$-type layer 9. The p$^-$-type layer 10 may preferably have an activated impurity concentration of about $1.0 \times 10^{16}$ to $1.0 \times 10^{18}$ cm$^{-3}$ and a depth of about 0.1 to 1.5 μm. Next, a sixth JTE region (p$^-$-type layer) 14 is formed by patterning and ion implantation of aluminum so that at least a portion thereof is positioned on top of the p$^-$-type layer 12 and is contiguous with the p$^-$-type layer 10. The p$^-$-type layer 14 may preferably have an activated impurity concentration of about $1.0 \times 10^{16}$ to $1.0 \times 10^{18}$ cm$^{-3}$ and a depth of about 0.1 to 1.5 μm. Thereafter, production is by processes similar to those of the first embodiment. By the processes described above, the edge termination structure region 101 of the fourth embodiment may be formed.

In the example of the edge termination structure region 101 depicted in FIG. 11, the front surface side of the p$^-$-type layer 7 is in contact with the p$^-$-type layers 9, 12. Further, the front surface side of the p$^-$-type layer 12 is in contact with the p$^-$-type layers 10, 14.

According to the edge termination structure region 101 depicted in FIG. 11, in addition to the structure depicted in the first embodiment (FIG. 4), the p$^-$-type layers 9, 10, 12, 14 are formed more superficially than the p$^-$-type layers 6, 7. Further, the p$^-$-type layers 6, 7, 9, 12, 10, 14 are formed such that integral values of the acceptor concentration in the height direction indicated by dose amounts of the p$^-$-type layers become a-line dose amount>b-line dose amount>c-line dose amount>d-line dose amount>e-line dose amount>f-line dose amount indicated in FIG. 11 whereby the dose amounts decrease with increasing distance from the end of the active region 102 and thus, is preferable.

For example, preferably, the p⁻-type layer 9 may be farther from the end of the active region 102 than the p⁻-type layer 6 is; the p⁻-type layer 10 may be farther from the end of the active region 102 than the p⁻-type layer 9 is; the p⁻-type layer 12 may be farther from the end of the active region 102 than the p⁻-type layer 7 is; and the p⁻-type layer 14 may be farther from the end of the active region 102 than the p⁻-type layer 12 is. Further, an effect of maintaining the breakdown voltage is obtained by such a concentration gradation of at least two steps or more in a height direction region. According to the fourth embodiment described, the length of the edge termination structure region 101 in the horizontal direction may be reduced a greater extent than in the first embodiment (FIG. 1).

Figure 12:
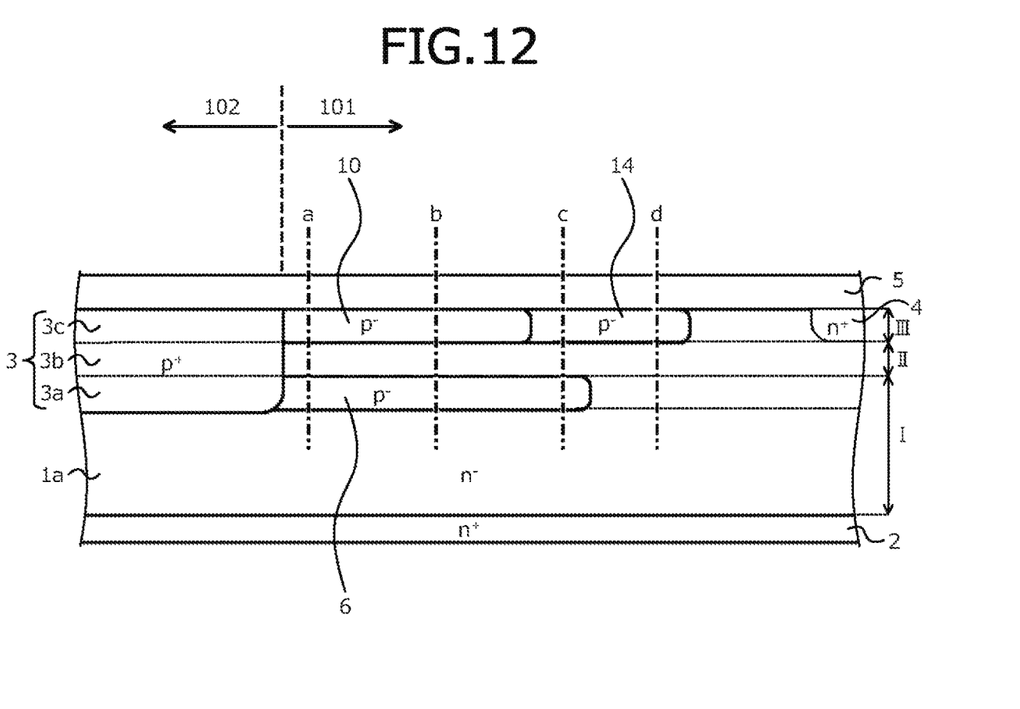
FIG. 12 is a cross-sectional view of the edge termination structure region of the semiconductor device according to a fifth embodiment.

FIG. 12 is a cross-sectional view of the edge termination structure region of the semiconductor device according to a fifth embodiment. In the fifth embodiment, for example, a silicon carbide semiconductor device produced using silicon carbide (SiC) as a wide bandgap semiconductor will be described taking a MOSFET as an example. In the fifth embodiment as well, an example of a structure of the active region 102 is similar to that of the first embodiment (FIG. 3) and a method of producing the active region 102 is also similar to that of the first embodiment.

Further, the method of producing the edge termination structure region 101 is similar up to the process of forming the p⁺-type layer 3b as described in the first embodiment (FIGS. 4 to 6). Subsequently, on the n⁻-type layer 1b, the n⁻-type layer 1c is formed by epitaxial growth with added nitrogen (refer to FIG. 7). Subsequently, the p⁻-type layer 10 and the p⁻-type layer 14 are formed similarly as in the fourth embodiment. Thereafter, production is by processes similar to those of the first embodiment. By the processes described above, the edge termination structure region 101 of the fifth embodiment may be formed.

According to the structure depicted in FIG. 12, the concentration gradation of a height direction region of the edge termination structure region 101 is set to a minimum of two steps, enabling simplification in structure and manufacturing as well as maintenance of the breakdown voltage.

Figure 13:
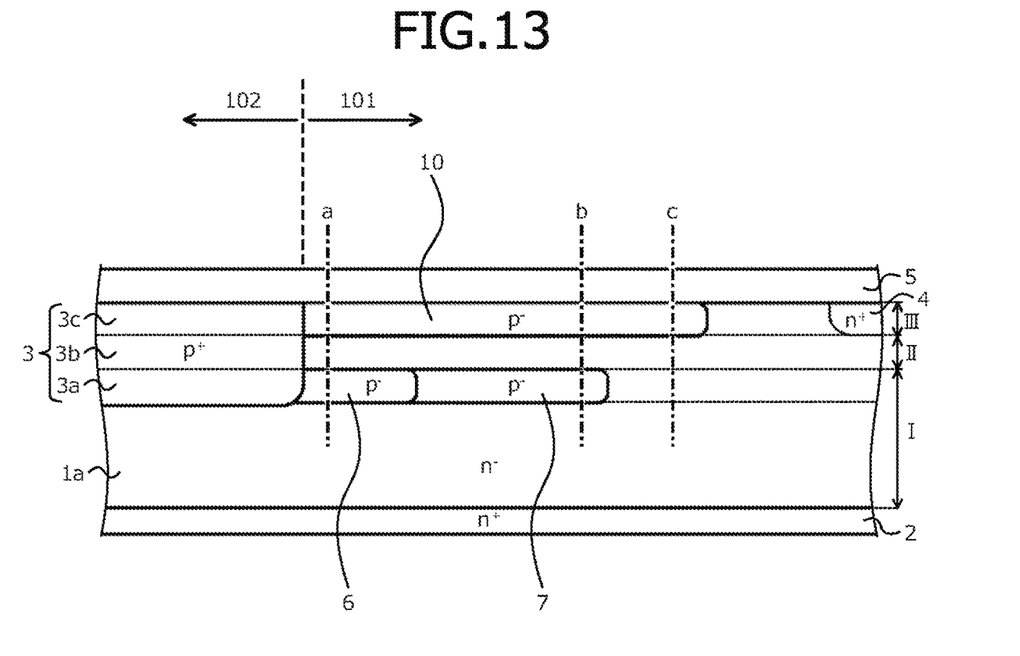
FIG. 13 is a cross-sectional view of the edge termination structure region of the semiconductor device according to a sixth embodiment.

FIG. 13 is a cross-sectional view of the edge termination structure region of the semiconductor device according to a sixth embodiment. In the sixth embodiment, for example, a silicon carbide semiconductor device produced using silicon carbide (SiC) as a wide bandgap semiconductor will be described taking a MOSFET as an example. In the sixth embodiment as well, an example of a structure of the active region 102 is similar to that of the first embodiment (FIG. 3) and a method of producing the active region 102 is also similar to that of the first embodiment.

Further, the method of producing the edge termination structure region 101 is similar up to the process of forming the p⁺-type layer 3c as described in the first embodiment (FIGS. 4 to 6). Subsequently, the p⁻-type layer 10 is formed by patterning and ion implantation of aluminum. The p⁻-type layer 10 may preferably have an activated impurity concentration of about $1.0 \times 10^{16}$ to $1.0 \times 10^{18}$ cm⁻³ and a depth of about 0.1 to 1.5 μm. Thereafter, production is by processes similar to those of the first embodiment. By the processes described above, the edge termination structure region 101 of the sixth embodiment may be formed.

According to the structure of the edge termination structure region 101 depicted in FIG. 13, by additionally providing only the p⁻-type layer 10 of a uniform concentration in the horizontal direction, a similar effect of maintaining the breakdown voltage may be obtained as in the first embodiment (FIG. 1), without providing the gradation in the horizontal direction.

Figure 14:
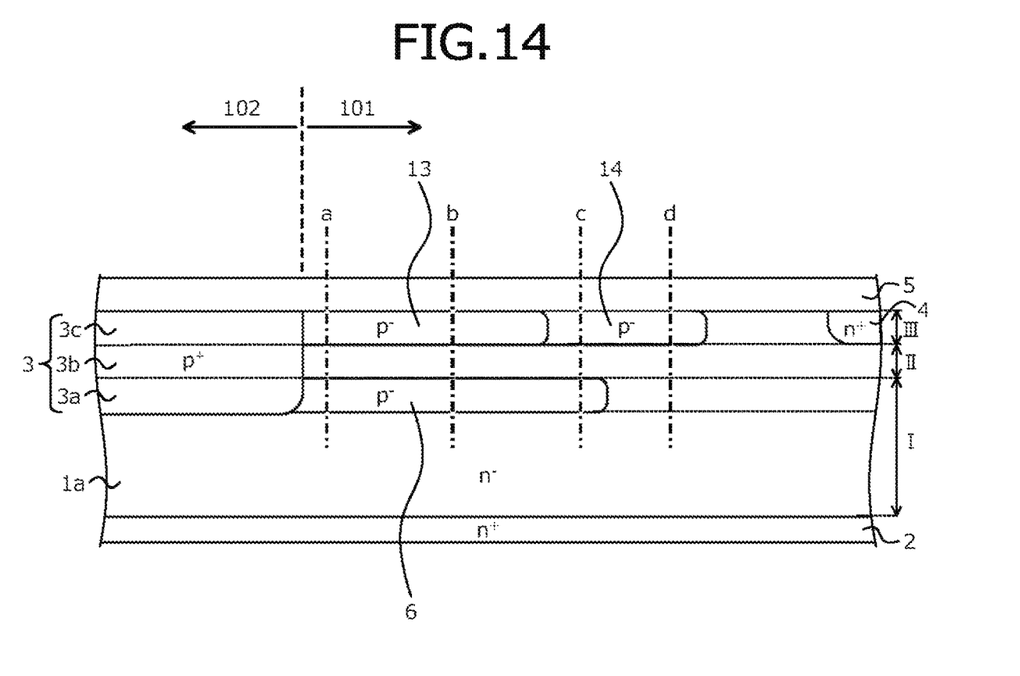
FIG. 14 is a cross-sectional view of the edge termination structure region of the semiconductor device according to a seventh embodiment.

FIG. 14 is a cross-sectional view of the edge termination structure region of the semiconductor device according to a seventh embodiment. In the seventh embodiment, for example, a silicon carbide semiconductor device produced using silicon carbide (SiC) as a wide bandgap semiconductor will be described taking a MOSFET as an example. In the seventh embodiment as well, an example of a structure of the active region 102 is similar to that of the first embodiment (FIG. 3) and a method of producing the active region 102 is also similar to that of the first embodiment.

Further, the method of producing the edge termination structure region 101 is similar up to the process of forming the p⁺-type layer 3c as described in the first embodiment (FIG. 4 to FIG. 6). Subsequently, on the n⁻-type layer 1b, the n⁻-type layer 1c is formed by epitaxial growth with added nitrogen (refer to FIG. 7). Thereafter, production is by processes similar to those of the first embodiment. By the processes described above, the edge termination structure region 101 of the sixth embodiment may be formed.

As indicated by the structure of the edge termination structure region 101 depicted in FIG. 14, even when the vertical positional relationship between the p⁻-type layers are interchanged with respect to the first embodiment (FIG. 1), similar effects of enabling the breakdown voltage to be maintained and the length in the horizontal direction to be shortened are obtained.

Figure 15:
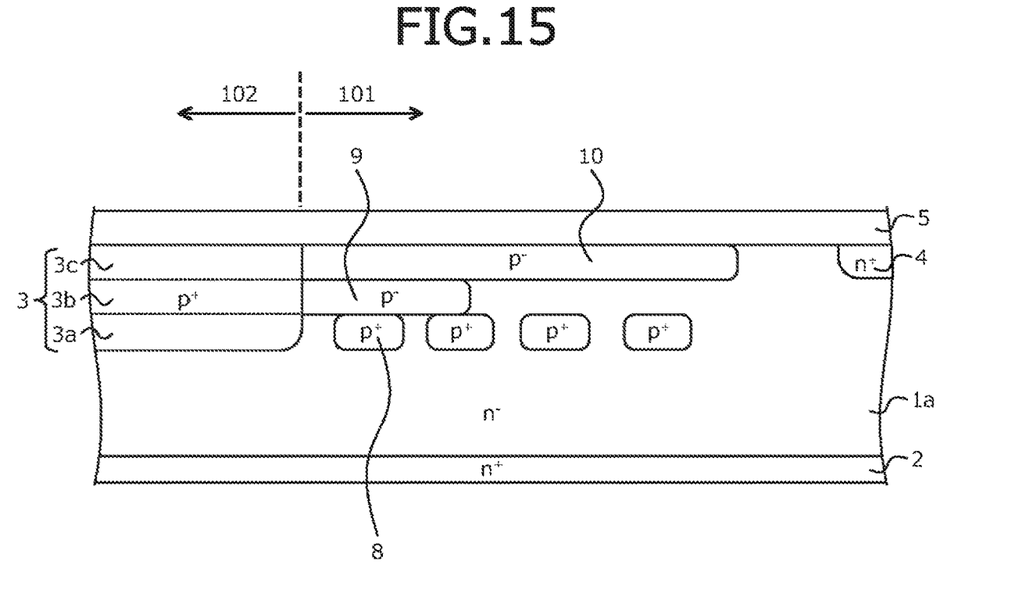
FIG. 15 is a cross-sectional view of the edge termination structure region of the semiconductor device according to an eighth embodiment.

FIG. 15 is a cross-sectional view of the edge termination structure region of the semiconductor device according to an eighth embodiment. In the eighth embodiment, a silicon carbide semiconductor device produced using silicon carbide (SiC) as a wide bandgap semiconductor will be described taking a MOSFET as an example. In the eighth embodiment as well, an example of a structure of the active region 102 is similar to that of the first embodiment (FIG. 3) and a method of producing the active region 102 is also similar to that of the first embodiment.

Further, the method of producing the edge termination structure region 101 is similar up to the process of forming the p⁺-type layer 3b as described in the second embodiment (FIG. 9). Subsequently, the p⁻-type layer 9 is formed on the front surface side of the p⁺-type layer 3b by patterning and ion implantation of aluminum. The p⁻-type layer 9 may preferably have an activated impurity concentration of about $1.0 \times 10^{16}$ to $1.0 \times 10^{18}$ cm⁻³ and a depth of about 0.1 to 1.5 μm. Thereafter, production is by processes similar to those of the third embodiment (refer to FIG. 10, on the front surface side of the p⁻-type layer 9, the p⁻-type layer 10, etc. are formed). By the processes described above, the edge termination structure region 101 of the eighth embodiment may be formed.

In the structure of the edge termination structure region 101 depicted in FIG. 15, the p⁻-type layer 9 is formed to be in contact with the p⁺-type layers 8, the p⁻-type layer 10 is formed to be in contact with p⁻-type layer 9, and the p⁻-type layer 10 is formed extending to a position farther toward an end portion than the position to which the p⁻-type layer 9 extends.

The structure of the edge termination structure region 101 depicted in FIG. 15 enables the length in the horizontal direction to be shortened to a greater extent as compared to the second embodiment (FIG. 9). In other words, the p⁻-type layers 9, 10 arranged more superficially than the p⁺-type layers 8 may adjust the electric field mitigated by the p⁺-type layers 8 thereunder, enabling the horizontal length of the edge termination structure region 101 to be shortened.

Figure 16:
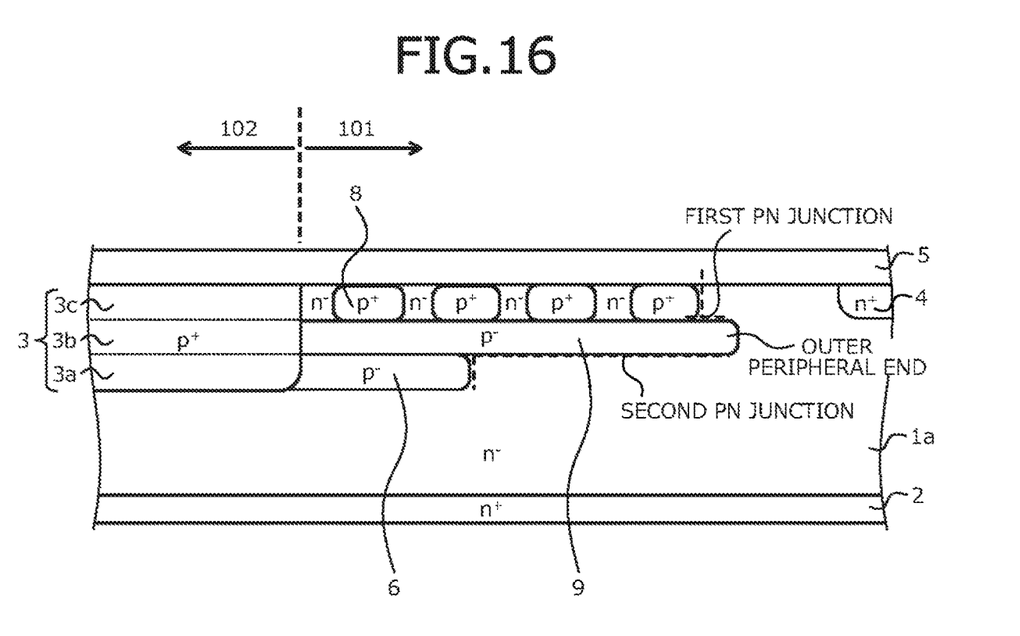
FIG. 16 is a cross-sectional view of the edge termination structure region of the semiconductor device according to a ninth embodiment.

FIG. 16 is a cross-sectional view of the edge termination structure region of the semiconductor device according to a ninth embodiment. In the ninth embodiment, a silicon carbide semiconductor device produced using silicon carbide (SiC) as a wide bandgap semiconductor will be described taking a MOSFET as an example. In the ninth embodiment as well, an example of a structure of the active region 102 is similar to that of the first embodiment (FIG. 3) and a method of producing the active region 102 is also similar to that of the first embodiment.

Further, the method of producing the edge termination structure region 101 is similar up to the process of forming the p$^+$-type layer 3c as described in the third embodiment (FIG. 10). Subsequently, the p$^+$-type layers 8 are formed on the front surface side of the p$^-$-type layer 9 by patterning and ion implantation of aluminum. The p$^+$-type layers 8 may preferably have an activated impurity concentration of about $1.0 \times 10^{17}$ to $1.0 \times 10^{19}$ cm$^{-3}$ and a depth of about 0.1 to 1.5 μm. Further, the p$^+$-type layers 8 may be formed concurrently with the p$^+$-type layer 3c, or the p$^+$-type layer 18 of the active region 102.

Thereafter, the n$^+$-type layer 4 is formed by patterning by photolithography and ion implantation of phosphorus, or arsenic, or nitrogen. The n$^+$-type layer 4 may preferably have an activated impurity concentration of about $1.0 \times 10^{18}$ to $1.0 \times 10^{20}$ cm$^{-3}$ and a depth of about 0.05 to 0.5 μm. Further, the n$^+$-type layer 4 may be concurrently formed with the n$^+$-type layer 17 of the active region 102. Thereafter, production is by processes similar to those of the first embodiment. By the processes described above, the edge termination structure region 101 of the ninth embodiment may be formed.

In the structure of the edge termination structure region 101 depicted in FIG. 16, the p$^-$-type layer 9 is in contact with the front surface side of the p$^-$-type layer 6 as viewed from the lower layer and the p$^-$-type layer 9 is formed extending to a position farther toward an end portion than the position to which the p$^-$-type layer 6 extends. Further, the p$^+$-type layers 8 are formed contacting the front surface side of the p$^-$-type layer 9. The p$^+$-type layers 8 are not in contact with the p$^+$-type layer 3.

The structure of the edge termination structure region 101 depicted in FIG. 16 enables similar effects of enabling the breakdown voltage to be maintained and the length in the horizontal direction to be shortened even when the vertical positional relationship of the p$^+$-type layers 8 and the p$^-$-type layer 9 are interchanged with respect to the second embodiment (FIG. 9).

In the description above, although an example in a case in which a main surface of a silicon carbide substrate including silicon carbide is assumed to be (0001) face and on the (0001) face, a MOS is configured, the present embodiments are not limited hereto and various modifications are possible such as those related to the wide bandgap semiconductor, the surface orientation of the substrate main surface, etc.

Further, in the embodiments, although the first conductivity type is assumed to be an n-type and the second conductivity type is assumed to be a p-type, the embodiments are similarly implemented when the first conductivity type is a p-type and the second conductivity type is an n-type.

As described, the semiconductor device according to the present invention is useful for high voltage semiconductor devices used in power converting equipment and power supply devices such as in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device including, as a semiconductor region in which semiconductor layers are formed, an active region through which current flows and an edge termination region arranged outside the active region and in which an edge termination structure is formed, the semiconductor device comprising:
   a drift layer of a first conductivity type, as one of the semiconductor layers;
   a base layer of a second conductivity type as an other one of the semiconductor layers, the base layer being provided in the active region and in contact with the edge termination region;
   an interlayer insulating film provided on the semiconductor region, and being in direct contact with the base layer; and
   a channel stopper layer provided in an outer periphery of the edge termination region, wherein
   the edge termination region has:
      a first semiconductor layer of the second conductivity type, continuous from the base layer, and
      a second semiconductor layer of the first conductivity type, in contact with the first semiconductor layer and forming a PN junction therewith, and
   the first semiconductor layer has an outer peripheral end not in contact with the interlayer insulating film, so that a first distance from the outer peripheral end of the first semiconductor layer to the interlayer insulating film is greater than zero, and
   a second distance from the outer peripheral end of the first semiconductor layer to the channel stopper layer is greater than the first distance.

2. The semiconductor device according to claim 1, wherein
   the PN junction includes a first PN junction at the outer peripheral end of the first semiconductor layer.

3. The semiconductor device according to claim 2, wherein
   the first semiconductor layer has an impurity concentration lower than an impurity concentration of the base layer.

4. The semiconductor device according to claim 3, wherein
   the impurity concentration of the first semiconductor layer decreases with increasing proximity of the first semiconductor layer to the outer periphery of the edge termination region.

5. The semiconductor device according to claim 2, wherein
   a width of a first side of the first semiconductor layer, opposite to a second side of the first semiconductor layer facing the interlayer insulating film, decreases from the base layer toward the outer peripheral end of the first semiconductor layer.

6. The semiconductor device according to claim 5, wherein
   the first semiconductor layer further forms a second PN junction, at the first side thereof.

7. The semiconductor device according to claim 6, further comprising:

a third semiconductor layer of the second conductivity type, directly adjacent to the second semiconductor layer and the second side of the first semiconductor layer; and a fourth semiconductor layer of the second conductivity type, directly adjacent to the first side of the first semiconductor layer, wherein a first interface of the second semiconductor layer and the third semiconductor layer in a depth direction of the semiconductor device is relatively closer to the outer periphery of the edge termination region than is a second interface of the fourth semiconductor layer and the drift layer in the depth direction.

8. The semiconductor device according to claim 6, further comprising one PN junction formed by the second semiconductor layer at the second side of the first semiconductor layer in a depth direction of the semiconductor device, and an other PN junction formed by the drift layer at the first side of the first semiconductor layer, wherein the one PN junction is relatively closer to the outer periphery of the edge termination region than is the other PN junction.

9. The semiconductor device according to claim 1, wherein a length of the first semiconductor layer from the base layer to the outer peripheral end of the first semiconductor layer is greater than the second distance.

10. The semiconductor device according to claim 9, wherein the impurity concentration of the base layer is in a range of $1.0 \times 10^{17}$ to $1.0 \times 10^{19}$ cm$^{-3}$.

11. The semiconductor device according to claim 1, wherein the active region has a MOS gate that includes a trench.

12. The semiconductor device according to claim 11, wherein a bottom of the trench is closer to the interlayer insulating film than is a bottom of the base layer.

13. The semiconductor device according to claim 12, wherein the bottom of the trench is closer to the interlayer insulating film than is the first side of the first semiconductor layer.

14. The semiconductor device according to claim 13, further comprising:

a third semiconductor layer of the second conductivity type, directly adjacent to the second semiconductor layer and the second side of the first semiconductor layer; and a fourth semiconductor layer of the second conductivity type, directly adjacent to the first side of the first semiconductor layer, wherein the bottom of the base layer and a bottom of the fourth semiconductor layer are positioned at a same depth in a depth direction of the semiconductor device.

15. The semiconductor device according to claim 12, further comprising:

a third semiconductor layer of the second conductivity type, directly adjacent to the second semiconductor layer and the second side of the first semiconductor layer; and a fourth semiconductor layer of the second conductivity type, directly adjacent to the first side of the first semiconductor layer, wherein the bottom of the base layer and a bottom of the fourth semiconductor layer in the depth direction are located within a range of ±0.2 μm.

16. The semiconductor device according to claim 12, further comprising:

a third semiconductor layer of the second conductivity type, directly adjacent to the second semiconductor layer and the second side of the first semiconductor layer; and a fourth semiconductor layer of the second conductivity type, directly adjacent to the first side of the first semiconductor layer, wherein the bottom of the base layer and a bottom of the fourth semiconductor layer in the depth direction are located within a range of ±0.3 μm.

17. The semiconductor device according to claim 12, wherein the interlayer insulating film has a thickness in a range of 0.1 to 3.0 μm.

18. The semiconductor device according to claim 12, wherein the first semiconductor layer is formed by a semiconductor layer having an impurity concentration that is at most equal to an impurity concentration of the base layer.

19. The semiconductor device according to claim 1, wherein the second side of the first semiconductor layer that faces the interlayer insulating film is free of contact with the interlayer insulating film.

* * * * *